(12) United States Patent
Nakagawa

(10) Patent No.: US 10,062,830 B2
(45) Date of Patent: Aug. 28, 2018

(54) ELASTIC WAVE RESONATOR, ELASTIC WAVE FILTER, DUPLEXER, AND ELASTIC WAVE DEVICE

(71) Applicant: Murata Manufacturing Co., Ltd., Nagaokakyo-shi, Kyoto-fu (JP)

(72) Inventor: Ryo Nakagawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 7 days.

(21) Appl. No.: 15/586,314

(22) Filed: May 4, 2017

(65) Prior Publication Data

US 2017/0236991 A1    Aug. 17, 2017

Related U.S. Application Data

(63) Continuation of application No. PCT/JP2015/082103, filed on Nov. 16, 2015.

(30) Foreign Application Priority Data

Dec. 1, 2014  (JP) .................................. 2014-243184

(51) Int. Cl.
    *H03H 9/64*     (2006.01)
    *H03H 9/72*     (2006.01)
    (Continued)

(52) U.S. Cl.
    CPC ........ *H01L 41/0477* (2013.01); *H01L 41/107* (2013.01); *H03H 9/25* (2013.01); *H03H 9/64* (2013.01); *H03H 9/725* (2013.01)

(58) Field of Classification Search
    CPC .................................. H03H 9/64; H03H 9/725
    (Continued)

(56) References Cited

U.S. PATENT DOCUMENTS

| | | | |
|---|---|---|---|
| 8,143,681 B2 * | 3/2012 | Zaghloul | G01N 29/022 257/416 |
| 2010/0007444 A1 * | 1/2010 | Nordin | G01N 29/022 333/195 |

(Continued)

FOREIGN PATENT DOCUMENTS

| | | |
|---|---|---|
| JP | 02-295212 A | 12/1990 |
| JP | 2007-228011 A | 9/2007 |

(Continued)

OTHER PUBLICATIONS

Official Communication issued in International Patent Application No. PCT/JP2015/082103, dated Jan. 12, 2016.

(Continued)

*Primary Examiner* — Dean Takaoka
(74) *Attorney, Agent, or Firm* — Keating & Bennett, LLP

(57) ABSTRACT

An elastic wave resonator includes an interdigital transducer electrode provided on a piezoelectric substrate and including a first electrode layer made of Al or an alloy with Al as its primary component and including a first main surface on a side where the piezoelectric substrate is located and a second main surface on the opposite side from the first main surface. An SH wave is used as a propagated elastic wave. When a resonant frequency of the elastic wave resonator is fr and an anti-resonant frequency of the elastic wave resonator is fa, a minimum value of an absolute value of a distortion component in the first main surface calculated through a two-dimensional finite element method is about $1.4 \times 10^{-3}$ or less at a frequency f expressed as:

$$f = fr + 0.06 \times bw, \text{ where } bw \text{ is } fa - fr.$$

21 Claims, 7 Drawing Sheets

(51) Int. Cl.
*H01L 41/047* (2006.01)
*H03H 9/25* (2006.01)
*H01L 41/107* (2006.01)

(58) Field of Classification Search
USPC .................................................. 333/133, 193
See application file for complete search history.

(56) References Cited

U.S. PATENT DOCUMENTS

| | | |
|---|---|---|
| 2012/0182088 A1 | 7/2012 | Inoue et al. |
| 2013/0154763 A1 | 6/2013 | Takamine |
| 2018/0062604 A1* | 3/2018 | Koskela .................. H03H 3/08 |

FOREIGN PATENT DOCUMENTS

| | | |
|---|---|---|
| JP | 2012-151697 A | 8/2012 |
| WO | 2012/032832 A1 | 3/2012 |

OTHER PUBLICATIONS

Xu, "Finite Element Analysis of Second Order Effects on the Frequency Response of a Saw Device", IEEE, vol. 1, Oct. 22, 2000, pp. 187-190.

* cited by examiner

ELASTIC WAVE RESONATOR, ELASTIC WAVE FILTER, DUPLEXER, AND ELASTIC WAVE DEVICE

CROSS REFERENCE TO RELATED APPLICATIONS

This application claims the benefit of priority to Japanese Patent Application No. 2014-243184 filed on Dec. 1, 2014 and is a Continuation Application of PCT Application No. PCT/JP2015/082103 filed on Nov. 16, 2015. The entire contents of each application are hereby incorporated herein by reference.

BACKGROUND OF THE INVENTION

1. Field of the Invention

The present invention relates to an elastic wave resonator in which an interdigital transducer electrode is provided on a piezoelectric substrate, and to an elastic wave filter and duplexer including such an elastic wave resonator.

2. Description of the Related Art

Conventionally, elastic wave resonators are widely used as resonators defining band-pass filters included in cellular phones and the like. Japanese Unexamined Patent Application Publication No. 2-295212, for example, discloses an elastic wave resonator including a piezoelectric substrate and an interdigital transducer electrode provided on the piezoelectric substrate. Japanese Unexamined Patent Application Publication No. 2-295212 discloses that the interdigital transducer electrode is made of Al film.

However, forming the interdigital transducer electrode from Al film as in the elastic wave resonator according to Japanese Unexamined Patent Application Publication No. 2-295212 has caused a decrease in the linearity of signals. There have thus been cases, when using the elastic wave resonator according to Japanese Unexamined Patent Application Publication No. 2-295212 in a transmission filter of a duplexer, where the level of non-linear signals emitted from the transmission filter increase and cause a decrease in the reception sensitivity.

SUMMARY OF THE INVENTION

Preferred embodiments of the present invention provide an elastic wave resonator that significantly reduces or prevents the occurrence of non-linear signals, as well as an elastic wave filter and a duplexer including such an elastic wave resonator.

An elastic wave resonator according to a preferred embodiment of the present invention includes a piezoelectric substrate and an interdigital transducer electrode located on the piezoelectric substrate. The interdigital transducer electrode includes a first electrode layer, made of Al or an alloy having Al as its primary component, that includes a first main surface on a side where the piezoelectric substrate is located and a second main surface on the opposite side from the first main surface. An SH wave is used as a propagated elastic wave. When a resonant frequency of the elastic wave resonator is represented by fr and an anti-resonant frequency of the elastic wave resonator is represented by fa, a minimum value of an absolute value of a distortion $S_4$ component in the first main surface calculated through a two-dimensional finite element method is about $1.4 \times 10^{-3}$ or less at a frequency f expressed as follows:

$$f = fr + 0.06 \times bw, \text{ where } bw \text{ is } fa-fr.$$

In a specific aspect of an elastic wave resonator according to a preferred embodiment of the present invention, a maximum value of the absolute value of the distortion $S_4$ component in the first main surface calculated through a two-dimensional finite element method is about $2.7 \times 10^{-3}$ or less at the frequency f. In this case, a decrease in the linearity of signals is further reduced or prevented.

An elastic wave resonator according to another broader aspect of a preferred embodiment of the present invention includes a piezoelectric substrate and an interdigital transducer electrode located on the piezoelectric substrate. The interdigital transducer electrode includes a first electrode layer, made of Al or an alloy having Al as its primary component, that includes a first main surface on a side where the piezoelectric substrate is located and a second main surface on the opposite side from the first main surface. An SH wave is used as a propagated elastic wave. When a resonant frequency of the elastic wave resonator is represented by fr and an anti-resonant frequency of the elastic wave resonator is represented by fa, a maximum value of an absolute value of a distortion $S_4$ component in the first main surface calculated through a two-dimensional finite element method is about $2.7 \times 10^{-3}$ or less at a frequency f expressed as follows:

$$f = fr + 0.06 \times bw, \text{ where } bw \text{ is } fa-fr.$$

In a specific aspect of an elastic wave resonator according to a preferred embodiment of the present invention, the interdigital transducer electrode includes a second electrode layer located on the piezoelectric substrate; the first electrode layer is laminated on the second electrode layer; and the second electrode layer includes at least one type of metal selected from a group consisting of Ti, Pt, Mo, W, Au, Cu, Ag, and NiCr.

In another specific aspect of an elastic wave resonator according to a preferred embodiment of the present invention, the first electrode layer includes a side surface connecting the first main surface and the second main surface, and at least a portion of the side surface makes contact with the second electrode layer; and a minimum value of an absolute value of the distortion $S_4$ component in the portion of the side surface of the first electrode layer that makes contact with the second electrode layer is about $1.4 \times 10^{-3}$ or less. In this case, a decrease in the linearity of signals is reliably reduced or prevented further.

In another specific aspect of an elastic wave resonator according to a preferred embodiment of the present invention, the first electrode layer includes a side surface connecting the first main surface and the second main surface, and at least a portion of the side surface makes contact with the second electrode layer; and a maximum value of an absolute value of the distortion $S_4$ component in the portion of the side surface of the first electrode layer that makes contact with the second electrode layer is about $2.7 \times 10^{-3}$ or less. In this case, a decrease in the linearity of signals is further reduced or prevented.

In yet another specific aspect of an elastic wave resonator according to a preferred embodiment of the present invention, the second electrode layer covers the first and second main surfaces and the side surface of the first electrode layer; and a minimum value of an absolute value of the distortion $S_4$ component in the first and second main surfaces and the side surface of the first electrode layer is about $1.4 \times 10^{-3}$ or less. In this case, a decrease in the linearity of signals is reliably further reduced or prevented.

In yet another specific aspect of an elastic wave resonator according to a preferred embodiment of the present invention, the second electrode layer covers the first and second main surfaces and the side surface of the first electrode layer; and a maximum value of an absolute value of the distortion $S_4$ component in the first and second main surfaces and the side surface of the first electrode layer is about $2.7 \times 10^{-3}$ or less. In this case, a decrease in the linearity of signals is reliably further reduced or prevented.

In yet another specific aspect of an elastic wave resonator according to a preferred embodiment of the present invention, the alloy with Al as its primary component is an alloy of Al and Cu.

An elastic wave filter according to a preferred embodiment of the present invention includes a plurality of elastic wave resonators, and at least one of the plurality of elastic wave resonators is an elastic wave resonator according to one of the preferred embodiments of the present invention as described above.

A duplexer according to a preferred embodiment of the present invention includes a band pass first filter including a plurality of elastic wave resonators, and a second filter including a plurality of elastic wave resonators and with a different pass band from the first filter. At least one of elastic wave resonators in at least one of the plurality of elastic wave resonators in first and second filters is an elastic wave resonator according to one of the preferred embodiments of the present invention as described above.

An elastic wave device according to a preferred embodiment of the present invention includes a first chip component including a plurality of transmission filters, and a second chip component including a plurality of reception filters. The plurality of transmission filters or the plurality of reception filters includes a plurality of elastic wave resonators. At least one of the elastic wave resonators in the plurality of elastic wave resonators is an elastic wave resonator according to one of the preferred embodiments of the present invention as described above.

With the elastic wave resonators according to preferred embodiments of the present invention, a minimum value or a maximum value of the absolute value of the distortion $S_4$ component in the first main surface of the first electrode layer defining the interdigital transducer electrode is reduced as described above. As such, the elastic wave resonators according to preferred embodiments of the present invention significantly reduce or prevent the occurrence of non-linear signals.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be made clear hereinafter through descriptions of specific preferred embodiments of the present invention with reference to the drawings.

Note that the various preferred embodiments disclosed in the present specification are merely examples, and it is to be understood that partial replacements or combinations of configurations among different preferred embodiments are also possible.

First Preferred Embodiment

Figure 1A:
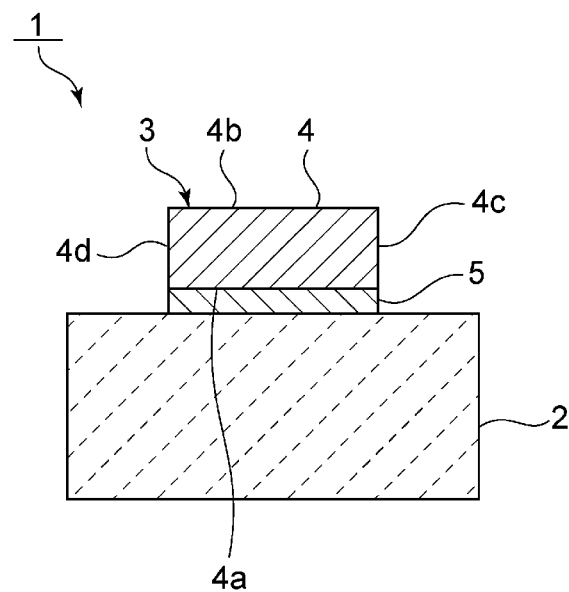
FIG. 1A is a schematic elevational cross-sectional view of an elastic wave resonator according to a first preferred embodiment of the present invention.
Figure 1B:
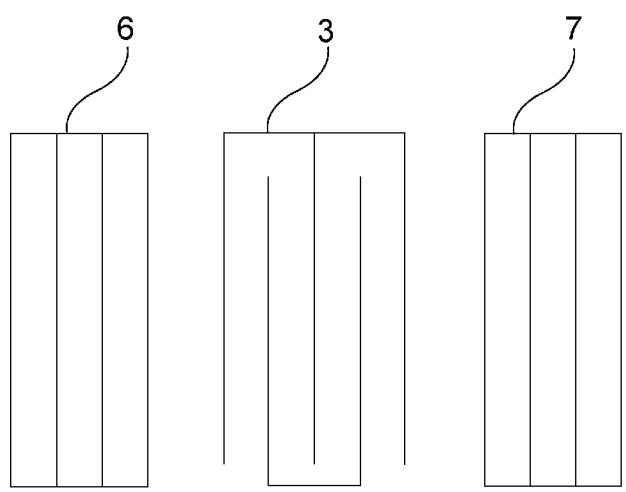
FIG. 1B is a schematic plan view illustrating the electrode structure thereof.

FIG. 1A is a schematic elevational cross-sectional view of an elastic wave resonator according to a first preferred embodiment of the present invention, and FIG. 1B is a schematic plan view illustrating the electrode structure thereof. An elastic wave resonator 1 includes a piezoelectric substrate 2. An interdigital transducer electrode 3 is laminated onto a main surface of the piezoelectric substrate 2. The interdigital transducer electrode 3 includes first and second electrode layers 4 and 5. More specifically, the interdigital transducer electrode 3 includes a second electrode layer 5 provided on the piezoelectric substrate 2, and a first electrode layer 4 laminated onto the second electrode layer 5.

The first electrode layer 4 includes first and second main surfaces 4a and 4b and first and second side surfaces 4c and 4d. The first main surface 4a of the first electrode layer 4 is located on the piezoelectric substrate 2 side. The first main surface 4a of the first electrode layer 4 makes contact with the second electrode layer 5. In other words, the first main surface 4a of the first electrode layer 4 defines and functions as a boundary surface between the first electrode layer 4 and the second electrode layer 5. The second main surface 4b of the first electrode layer 4 is on the side opposite from the first main surface $4a$. The first and second side surfaces $4c$ and $4d$ connect the first main surface $4a$ and the second main surface $4b$.

The piezoelectric substrate 2 is preferably a LiTaO$_3$ substrate, for example. However, the piezoelectric substrate 2 may be a substrate made of a different piezoelectric single-crystal, such as LiNbO$_3$, or may be a substrate made of piezoelectric ceramics.

Although only illustrated in a simplified manner in FIG. 1A, the electrode structure illustrated in FIG. 1B is provided on the piezoelectric substrate 2. In other words, the interdigital transducer electrode 3, and reflectors 6 and 7 disposed on both sides of a direction in which a surface acoustic wave propagates in the interdigital transducer electrode 3, are provided. This structure defines a single-port surface acoustic wave resonator.

The interdigital transducer electrode 3 includes first and second busbars and a plurality of first and second electrode fingers. The plurality of first electrode fingers and the plurality of second electrode fingers are fitted together so as to be inserted between each other. The plurality of first electrode fingers are connected to the first busbar, and the plurality of second electrode fingers are connected to the second busbar.

The first electrode layer 4 of the interdigital transducer electrode 3 is preferably made of Al, for example. The first electrode layer 4 of the interdigital transducer electrode 3 may be made of an alloy having Al as a primary component. An "alloy having Al as a primary component" refers to an alloy with an Al content of about 50% or more, for example, an alloy of Al and Cu (AlCu alloy).

On the other hand, the second electrode layer 5 of the interdigital transducer electrode 3 is preferably made of Ti, for example. Pt, Mo, W, Au, Cu, Ag, Ni, Cr, or an alloy thereof can be used as the material of the second electrode layer 5, instead of Ti. These may be single-layer metal films, or laminated metal films formed by laminating two or more metals.

In the present preferred embodiment, an SH wave is used as the propagated elastic wave, and a minimum value of an absolute value of a distortion $S_4$ component at the first main surface $4a$ of the first electrode layer 4, that is, at the boundary surface between the first electrode layer 4 and the second electrode layer 5, is no greater than about $1.4 \times 10^{-3}$, for example. Note that this specification assumes that a value calculated through a two-dimensional element finite method for a frequency f is used as the distortion $S_4$ component.

When a resonant frequency of the elastic wave resonator is represented by fr and an anti-resonant frequency is represented by fa, the frequency f is a frequency expressed as follows:

$f=fr+0.06 \times bw$, where $bw$ is $fa-fr$.

The distortion $S_4$ component is a z differential of displacement in a y-axis direction when coordinate axes (x, y, z) are applied to a crystal. Specifically, when a length direction of the electrode fingers is taken as a y direction and a thickness direction of the electrode fingers is taken as a z direction, and a length $l_y$ of the electrode fingers has changed to $l_y+u_y$, $S_4$ is expressed as $(\partial u_y/\partial z)$. The distortion $S_4$ component is calculated under the following conditions, through a two-dimensional finite element method calculation.

Values disclosed in the "Chemical Handbook, BASIC SERIES II, Fourth Edition; The Chemical Society of Japan, Maruzen Co. (1993)" are used for the elastic constant and density of the material of the first electrode layer 4 and the second electrode layer 5. For example, with respect to the elastic constant of Al, the Young's modulus is about $6.85 \times 10^{10}$ Pa and the Poisson ratio is about $3.4 \times 10^{-1}$, while the density is about $2.6989 \times 10^3$ kg/m$^3$. Meanwhile, with respect to the elastic constant of Ti, the Young's modulus is about $1.157 \times 10^{11}$ Pa and the Poisson ratio is about $3.2 \times 10^{-1}$, while the density is about $4.5 \times 10^3$ kg/m$^3$.

Values disclosed in the "Elastic Wave Device Technical Handbook, Japan Society for the Promotion of Science's 150th Committee on Elastic Wave Device Technology, Ohm Co. pg. 542" are used for the parameters of the piezoelectric substrate 2. For example, the elastic constant of LiTaO$_3$, which the piezoelectric substrate 2 is made of, is as follows: $c_{11}=2.298$, $c_{12}=0.44$, $c_{13}=0.812$, $c_{14}=-0.104$, $c_{22}=2.298$, $c_{23}=0.812$, $c_{24}=0.104$, $c_{33}=2.798$, $c_{44}=0.968$, $c_{55}=0.968$, $c_{56}=-0.104$, $c_{66}=0.929$, $c_{15}=c_{16}=c_{25}=c_{26}=c_{34}=c_{35}=c_{36}=c_{45}=c_{46}=0 \times 10^3$ Pa, $e_{ij}=c_{ji}$. The piezoelectric constant of LiTaO$_3$ is as follows: $e_{15}=2.72$, $e_{16}=-1.67$, $e_{21}=-1.67$, $e_{22}=1.67$, $e_{24}=2.72$, $e_{31}=-0.38$, $e_{32}=-0.38$, $e_{33}=1.09$, $e_{11}=e_{12}=e_{13}=e_{14}=e_{23}=e_{25}=e_{26}=e_{34}=e_{35}=e_{36}=0$ C/m$^2$. The relative permittivity of LiTaO$_3$ is as follows: $\varepsilon_{11}=42.6$, $\varepsilon_{22}=42.6$, $\varepsilon_{33}=4.28$, $\varepsilon_{12}=\varepsilon_{13}=\varepsilon_{23}=0$, $\varepsilon_{ij}=\varepsilon_{ji}$.

Figure 11:
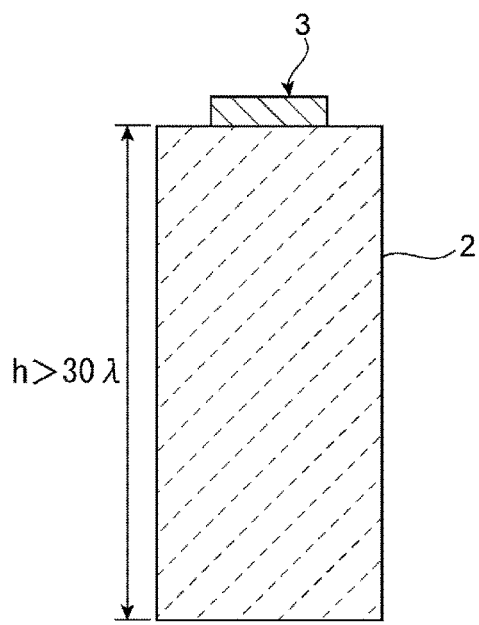
FIG. 11 is a diagram illustrating a piezoelectric substrate thickness ($h > 30\lambda$) used in a two-dimensional finite element method calculation.
Figure 12:
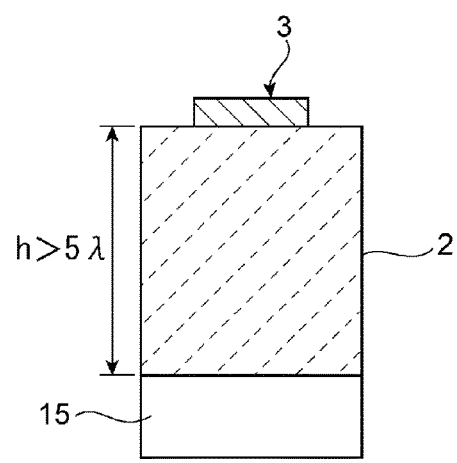
FIG. 12 is a diagram illustrating a piezoelectric substrate thickness ($h > 5\lambda$) used in a two-dimensional finite element method calculation.

The calculation model is an electrode finger pair model using a periodic boundary condition (with a phase difference condition of $2n\pi$). The thickness of the piezoelectric substrate 2 will be described with reference to FIGS. 11 and 12. FIGS. 11 and 12 are diagrams illustrating a piezoelectric substrate thickness used in a two-dimensional finite element method calculation. The thickness (h) of the piezoelectric substrate 2 is h>about $30\lambda$, as indicated in FIG. 11. Alternatively, h>about $5\lambda$ or greater as indicated in FIG. 12, and a perfectly matched layer (PML) 15 is provided on the main surface of the piezoelectric substrate 2 located on the side opposite from the side on which the interdigital transducer electrode 3 is located. This makes it possible to significantly reduce or prevent reflection of wave motion from the main surface of the piezoelectric substrate 2 located on the side opposite from the side on which the interdigital transducer electrode 3 is located.

With respect to boundary conditions, a potential of about +1.0 V is imparted on the boundary surface between the second electrode layer 5 and the piezoelectric substrate 2, and a potential of about 0 V is imparted on the main surface of the piezoelectric substrate 2 located on the side opposite from the side on which the interdigital transducer electrode 3 is located. The main surface of the piezoelectric substrate 2 located on the side opposite from the side on which the interdigital transducer electrode 3 is located is also given a constraint condition ($u_i=0$) for a displacement $u_i$ (i=1, 2, 3).

Figure 2:
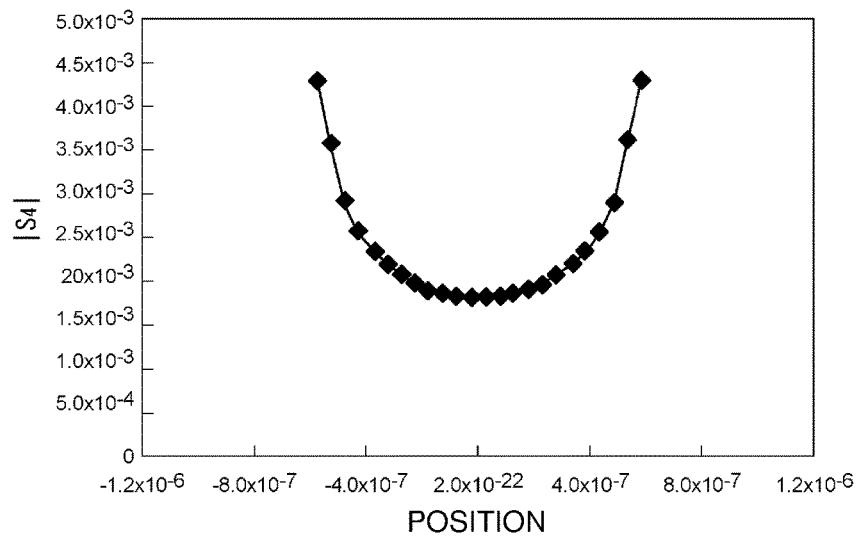
FIG. 2 is a graph indicating an absolute value ($|S_4|$) of a distortion component $S_4$ at various positions within a first main surface of a first electrode layer.

FIG. 2 is a graph indicating the absolute value ($|S_4|$) of the distortion component $S_4$ at various positions in the first main surface $4a$ of the first electrode layer 4. In other words, FIG. 2 is a graph indicating $|S_4|$ at various positions in the first main surface $4a$ of the first electrode layer 4, when varying the position at which $|S_4|$ is measured from the second side surface $4d$ side toward the first side surface $4c$ side. In FIG. 2, the negative side of the x-axis represents the second side surface $4d$ side, and the positive side represents the first side surface $4c$ side.

Figure 3:
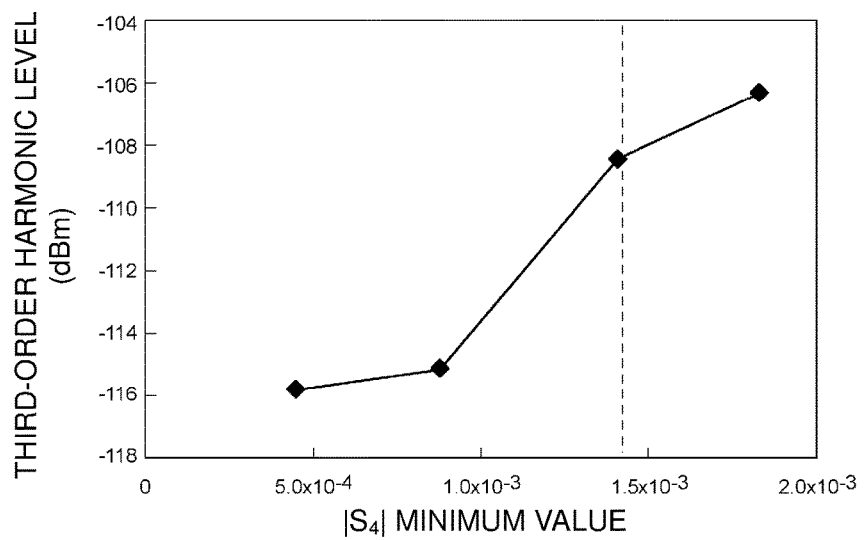
FIG. 3 is a graph illustrating a relationship between a minimum value of the absolute value ($|S_4|$) of the distortion component $S_4$ in the first main surface of the first electrode layer, and a peak level of a third-order harmonic.

FIG. 3 is a graph illustrating a relationship between the minimum value of the absolute value ($|S_4|$) of the distortion component $S_4$ in the first main surface $4a$ of the first electrode layer 4, and a peak level of a third-order harmonic. In FIG. 3, the minimum value of $|S_4|$ is the minimum value of $|S_4|$ indicated in FIG. 2. In other words, this is the minimum value of $|S_4|$ at various positions in the first main surface 4a of the first electrode layer 4, when varying the position at which $|S_4|$ is measured from the second side surface 4d side toward the first side surface 4c side.

Figure 5:
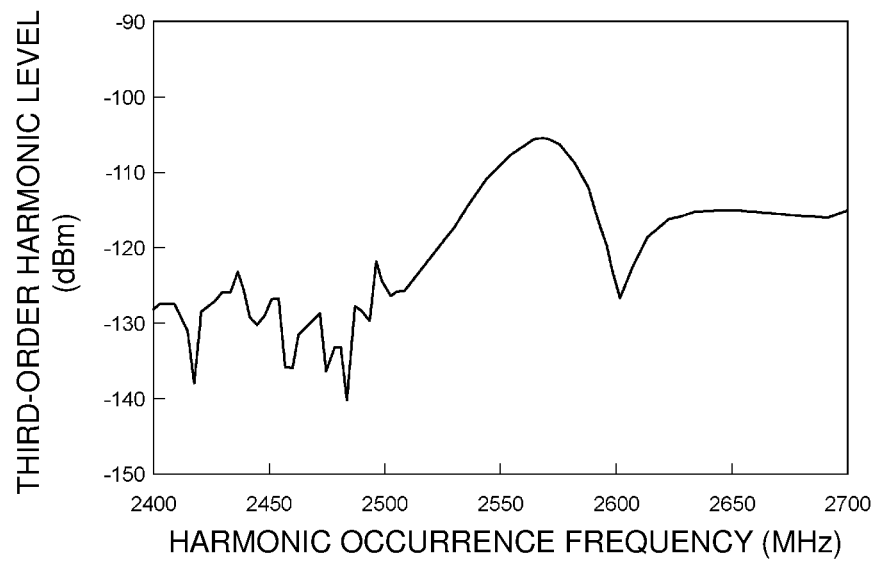
FIG. 5 is a diagram illustrating a relationship between a harmonic occurrence frequency and a third-order harmonic level.

Although FIG. 3 indicates the minimum value of $|S_4|$ at four points, note that these are values obtained by varying the thicknesses of the first electrode layer 4 and the second electrode layer 5. More specifically, $|S_4|$ at the four points in FIG. 3 correspond to values when the film thicknesses of the first electrode layer 4 and the second electrode layer 5 are about 100 nm and about 248 nm, about 200 nm and about 184 nm, about 300 nm and about 110 nm, and about 430 nm and about 30 nm, respectively, from the left side of the graph. Meanwhile, the third-order harmonic peak level refers to the third-order harmonic level being at a peak, as indicated in FIG. 5.

As indicated in FIG. 3, the occurrence of non-linear signals is suppressed when the minimum value of $|S_4|$ is about $1.4 \times 10^{-3}$ or less, for example.

Second Preferred Embodiment

In the first preferred embodiment, the minimum value of the absolute value of the distortion $S_4$ component in the first main surface 4a is preferably about $1.4 \times 10^{-3}$ or less, for example. In a second preferred embodiment of the present invention, the maximum value of the absolute value of the distortion $S_4$ component in the first main surface 4a preferably is about $2.7 \times 10^{-3}$ or less, for example. The second preferred embodiment is preferably the same or substantially the same as the first preferred embodiment in other respects. The maximum value of the absolute value of the distortion $S_4$ component will be described in detail hereinafter with reference to FIG. 4.

Figure 4:
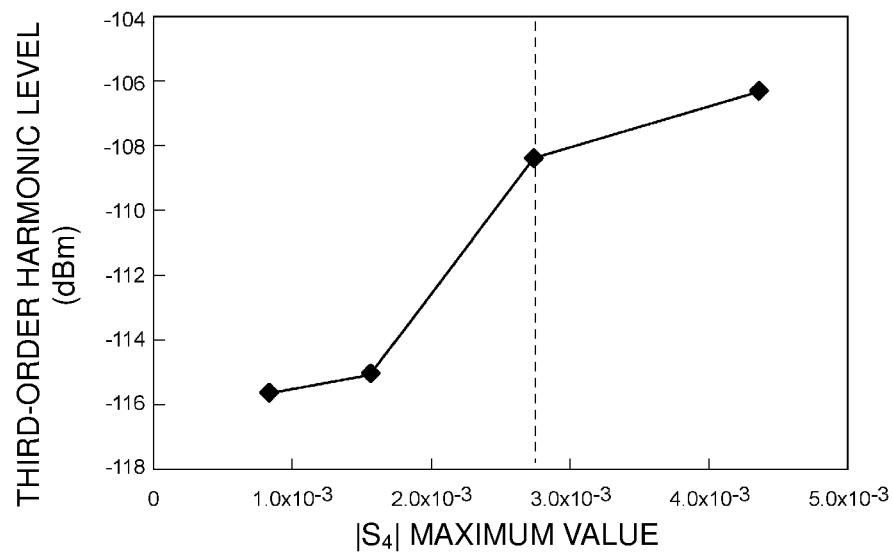
FIG. 4 is a graph illustrating a relationship between a maximum value of the absolute value ($|S_4|$) of the distortion component $S_4$ in the first main surface of the first electrode layer, and the peak level of the third-order harmonic.

FIG. 4 is a graph illustrating a relationship between the maximum value of the absolute value ($|S_4|$) of the distortion component $S_4$ in the first main surface 4a of the first electrode layer 4, and a peak level of a third-order harmonic. In FIG. 4, the maximum value of $|S_4|$ is the maximum value of $|S_4|$ indicated in FIG. 2. In other words, this is the maximum value of $|S_4|$ at various positions in the first main surface 4a of the first electrode layer 4, when varying the position at which $|S_4|$ is measured from the second side surface 4d side toward the first side surface 4c side.

Although FIG. 4 indicates the maximum value of $|S_4|$ at four points, note that these are values obtained by varying the thicknesses of the first electrode layer 4 and the second electrode layer 5. Meanwhile, the third-order harmonic peak level refers to the third-order harmonic level being at a peak, as indicated in FIG. 5.

As indicated in FIG. 4, the occurrence of non-linear signals is suppressed when the maximum value of $|S_4|$ is about $2.7 \times 10^{-3}$, for example.

In various preferred embodiments of the present invention, the minimum value of the absolute value of the distortion $S_4$ component may be about $1.4 \times 10^{-3}$ or less, and at the same time, the maximum value of the absolute value of the distortion $S_4$ component may be about $2.7 \times 10^{-3}$ or less. In this case, the occurrence of non-linear signals is significantly reduced or prevented even further.

Third Preferred Embodiment

Figure 6:
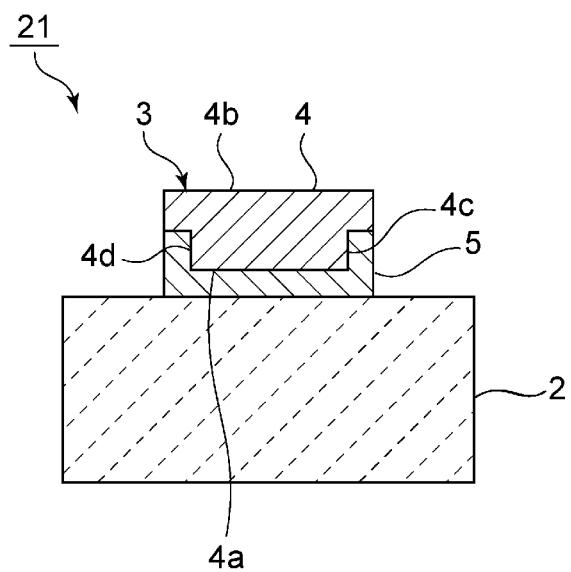
FIG. 6 is a schematic elevational cross-sectional view of an elastic wave resonator according to a third preferred embodiment of the present invention.

FIG. 6 is a schematic elevational cross-sectional view of an elastic wave resonator according to a third preferred embodiment of the present invention. In an elastic wave resonator 21, portions of the first and second side surfaces 4c and 4d of the first electrode layer 4 make contact with the second electrode layer 5.

In the elastic wave resonator 21, the minimum value of the absolute value of the distortion $S_4$ component preferably is about $1.4 \times 10^{-3}$ or less at the portions where the first and second side surfaces 4c and 4d of the first electrode layer 4 make contact with the second electrode layer 5. Alternatively, the maximum value of the absolute value of the distortion $S_4$ component is about $2.7 \times 10^{-3}$ or less at the portions where the first and second side surfaces 4c and 4d of the first electrode layer 4 make contact with the second electrode layer 5. The third preferred embodiment is preferably the same or substantially the same as the first preferred embodiment in other respects.

As a non-limiting example of a method for forming the second electrode layer 5, a flat electrode layer is first formed through deposition or the like. A resist film slightly smaller than the flat electrode layer is then formed on the flat electrode layer. Next, an electrode layer is formed, from the same material as the flat electrode layer, so as to cover the resist film and the flat electrode layer. Anisotropic etching is then carried out using an etching device such that the electrode layer remains only on side walls of the resist film. The resist film is then removed. The second electrode layer 5 is formed as a result. The first electrode layer 4 is then laminated in order to form the interdigital transducer electrode 3. In the interdigital transducer electrode 3 formed in this manner, the portions of the first electrode layer 4 that make contact with the second electrode layer 5 correspond to the first main surface 4a and the first and second side surfaces 4c and 4d of the first electrode layer 4.

In the third preferred embodiment, the minimum value or maximum value of the absolute value of the distortion $S_4$ component is reduced at the portions of the first main surface 4a and the first and second side surfaces 4c and 4d of the first electrode layer 4 that make contact with the second electrode layer 5. In other words, the minimum value or the maximum value of the absolute value of the distortion $S_4$ component is reduced at the boundary surface between the first electrode layer 4 and the second electrode layer 5. As such, the elastic wave resonator 21 according to the third preferred embodiment significantly reduces or prevents the occurrence of non-linear signals.

Fourth Preferred Embodiment

Figure 7:
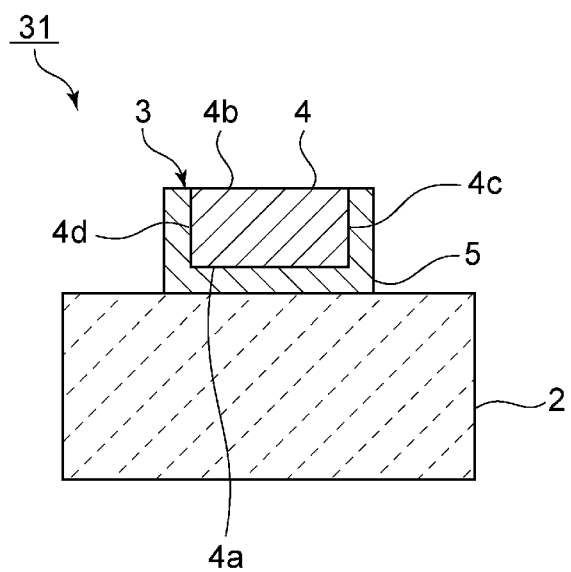
FIG. 7 is a schematic elevational cross-sectional view of an elastic wave resonator according to a fourth preferred embodiment of the present invention.

FIG. 7 is a schematic elevational cross-sectional view of an elastic wave resonator according to a fourth preferred embodiment of the present invention. In an elastic wave resonator 31, the first and second side surfaces 4c and 4d of the first electrode layer 4 make contact with the second electrode layer 5. The second electrode layer 5 including the first and second side surfaces 4c and 4d is preferably formed in the same manner as in the above-described third preferred embodiment.

In the elastic wave resonator 31, the minimum value of the absolute value of the distortion $S_4$ component preferably is about $1.4 \times 10^{-3}$ or less in the first and second side surfaces 4c and 4d of the first electrode layer 4. Alternatively, the maximum value of the absolute value of the distortion $S_4$ component preferably is about $2.7 \times 10^{-3}$ or less in the first and second side surfaces 4c and 4d of the first electrode layer 4. The fourth preferred embodiment preferably is the same or substantially the same as the first preferred embodiment in other respects.

In the fourth preferred embodiment, the minimum value or maximum value of the absolute value of the distortion $S_4$ component is reduced in the first main surface 4a and the first and second side surfaces 4c and 4d of the first electrode layer 4. In other words, the minimum value or the maximum value of the absolute value of the distortion $S_4$ component is reduced at the boundary surface between the first electrode layer 4 and the second electrode layer 5. As such, the elastic wave resonator 31 according to the fourth preferred embodiment significantly reduces or prevents the occurrence of non-linear signals.

Fifth Preferred Embodiment

Figure 8:
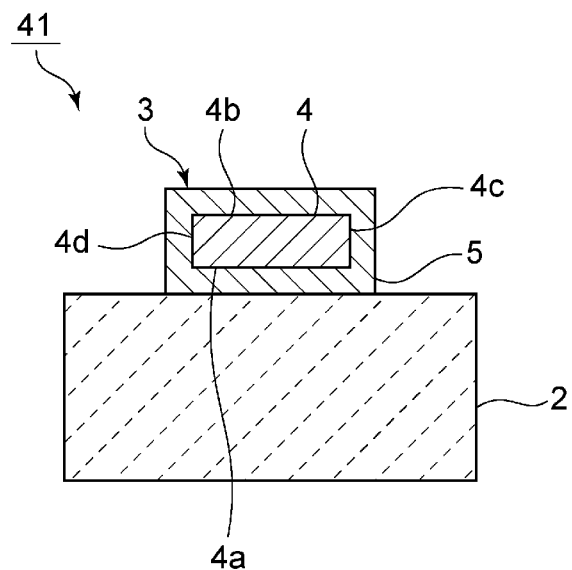
FIG. 8 is a schematic elevational cross-sectional view of an elastic wave resonator according to a fifth preferred embodiment of the present invention.

FIG. 8 is a schematic elevational cross-sectional view of an elastic wave resonator according to a fifth preferred embodiment of the present invention. In an elastic wave resonator 41, the second main surface 4b and the first and second side surfaces 4c and 4d of the first electrode layer 4 make contact with the second electrode layer 5. The second electrode layer 5 including the first and second side surfaces 4c and 4d is preferably formed in the same manner as in the above-described third and fourth preferred embodiments.

In the elastic wave resonator 41, the minimum value of the absolute value of the distortion $S_4$ component preferably is about $1.4 \times 10^{-3}$ or less in the second main surface 4b and the first and second side surfaces 4c and 4d of the first electrode layer 4. Alternatively, the maximum value of the absolute value of the distortion $S_4$ component preferably is about $2.7 \times 10^{-3}$ or less in the second main surface 4b and the first and second side surfaces 4c and 4d of the first electrode layer 4. The fifth preferred embodiment preferably is the same or substantially the same as the first preferred embodiment in other respects.

In the fifth preferred embodiment, the minimum value or the maximum value of the absolute value of the distortion $S_4$ component is reduced in the first and second main surfaces 4a and 4b and the first and second side surfaces 4c and 4d of the first electrode layer 4. In other words, the minimum value or the maximum value of the absolute value of the distortion $S_4$ component is reduced at the boundary surface between the first electrode layer 4 and the second electrode layer 5. As such, the elastic wave resonator 41 according to the fifth preferred embodiment significantly reduces or prevents the occurrence of non-linear signals.

Sixth Preferred Embodiment

Figure 9:
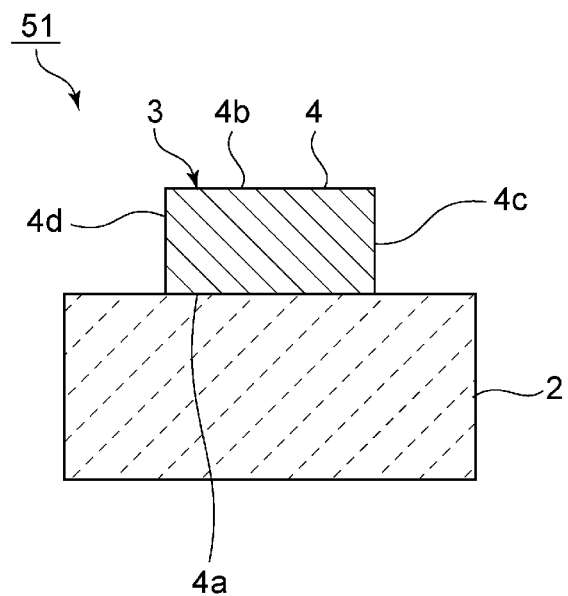
FIG. 9 is a schematic elevational cross-sectional view of an elastic wave resonator according to a sixth preferred embodiment of the present invention.

FIG. 9 is a schematic elevational cross-sectional view of an elastic wave resonator according to a sixth preferred embodiment of the present invention. In an elastic wave resonator 51, the second electrode layer is not provided. Accordingly, the first main surface 4a of the first electrode layer 4 makes contact with the piezoelectric substrate 2. The sixth preferred embodiment is preferably the same or substantially the same as the first preferred embodiment in other respects.

In the sixth preferred embodiment, the minimum value of the absolute value of the distortion $S_4$ component in the first main surface 4a of the first electrode layer 4, or in other words, at the boundary surface between the first electrode layer 4 and the piezoelectric substrate 2, preferably is about $1.4 \times 10^{-3}$ or less. Alternatively, the maximum value of the absolute value of the distortion $S_4$ component preferably is about $2.7 \times 10^{-3}$ or less. As such, the elastic wave resonator 51 according to the sixth preferred embodiment significantly reduces or prevents the occurrence of non-linear signals.

Figure 10:
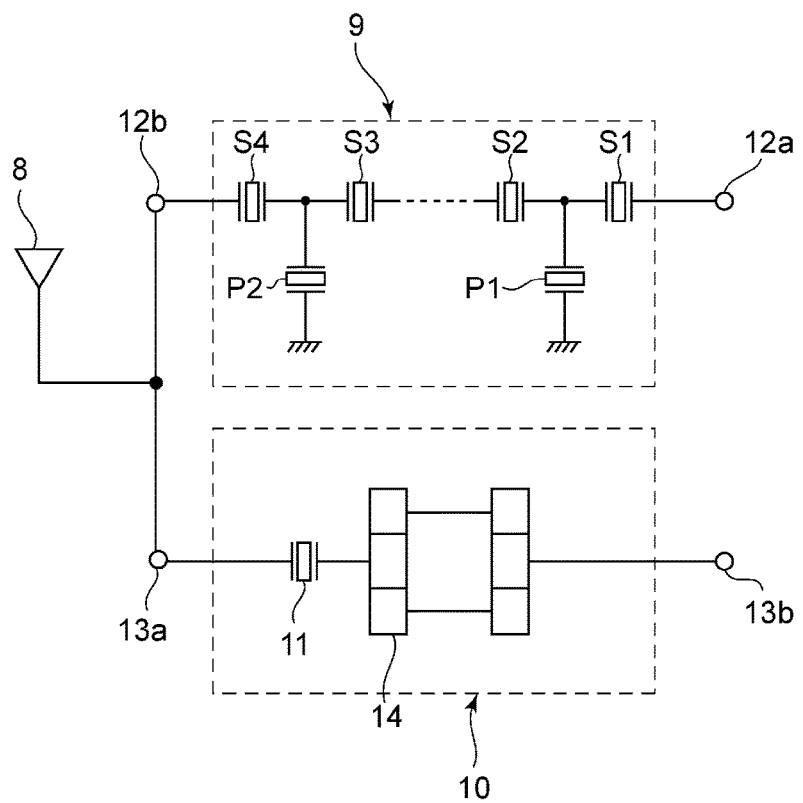
FIG. 10 is a circuit diagram illustrating an overview of a duplexer according to a preferred embodiment of the present invention.

FIG. 10 is a circuit diagram illustrating an overview of a duplexer according to a preferred embodiment of the present invention. The duplexer according to the present preferred embodiment includes a first filter 9 and a second filter 10 connected in common to an antenna 8.

The first filter 9 is a band pass transmission filter. The first filter 9 is a ladder filter. The first filter 9 includes an input terminal 12a, which is a transmission terminal, and an output terminal 12b. A plurality of serial arm resonators S1 to S4 are arranged in a serial arm connecting the input terminal 12a and the output terminal 12b. A parallel arm resonator P1 is connected between a ground potential, and a point of connection between the serial arm resonator S1 and the serial arm resonator S2. A parallel arm resonator P2 is connected between a ground potential, and a point of connection between the serial arm resonator S3 and the serial arm resonator S4.

The second filter 10 is a reception filter with a different pass band from the first filter 9. The second filter includes a longitudinally coupled resonator elastic wave filter 14. The second filter 10 includes an input terminal 13a, and an output terminal 13b defining and functioning as a reception terminal. An elastic wave resonator 11 is connected between the input terminal 13a and the longitudinally coupled resonator elastic wave filter 14. The input terminal 13a is connected to the antenna 8 through a common point of connection with the output terminal 12b. Note that in various preferred embodiments of the present invention, a ladder filter, a longitudinally coupled resonator filter, a lattice filter, or the like may be used as the filters used as the first and second filters.

Normally, when the level of non-linear signals that occur increases in a transmission filter used in a duplexer, the reception sensitivity of the reception filter will decrease.

However, in the present preferred embodiment, the serial arm resonator S4 of the first filter 9 is the elastic wave resonator according to one of the preferred embodiments of the present invention as described above. In other words, in the serial arm resonator S4 connected to the second filter 10 serving as the reception filter, the minimum value of the absolute value of the distortion $S_4$ component in the first main surface 4a of the first electrode layer 4 preferably is about $1.4 \times 10^{-3}$ or less. Alternatively, the maximum value of the absolute value of the distortion $S_4$ component preferably is about $2.7 \times 10^{-3}$ or less. Accordingly, the level of non-linear signals occurring in the serial arm resonator S4 is significantly reduced or prevented, which in turn makes it difficult for the duplexer according to the present preferred embodiment to experience a decrease in reception sensitivity.

However, in a preferred embodiment of the present invention, it is sufficient for the minimum value of the absolute value of the distortion $S_4$ component or the maximum value of the absolute value of the distortion $S_4$ component to be within the above-described range in the first main surface of the first electrode layer of at least one of the plurality of elastic wave resonators that define the elastic wave filter.

In the case where the duplexer according to a preferred embodiment of the present invention includes a transmission filter and a reception filter with different pass bands, it is sufficient for the minimum value or the maximum value of the absolute value of the distortion $S_4$ component in at least one of the elastic wave resonators in the transmission filter to be within the above-described ranges. A decrease in the reception sensitivity of the duplexer is significantly reduced or prevented as a result.

Meanwhile, in a single-chip duplexer including a transmission filter and a reception filter, there are cases where it is necessary to reduce the level of non-linear signals only in either the transmission filter or the reception filter. In such a case, it is preferable that the structure of a preferred embodiment of the present invention be applied only in the filter in which the level of non-linear signals is to be reduced, but implementing such a structure in a single-chip duplexer is difficult.

Figure 13:
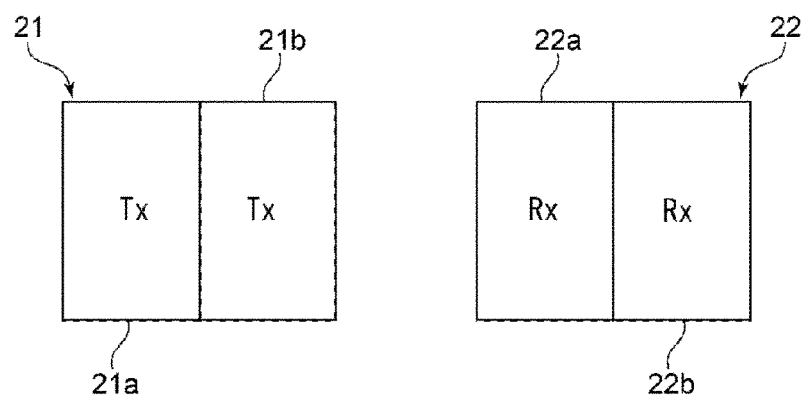
FIG. 13 is a schematic plan view of a duplexer according to another preferred embodiment of the present invention.

On the other hand, cellular phones and the like often include a plurality of duplexers. Thus, in the case where it is necessary to reduce the level of non-linear signals only in either the transmission filter or the reception filter, it is preferable to use the preferred embodiment illustrated in FIG. 13. In FIG. 13, a transmission filter 21a and a transmission filter 21b define a first chip component 21. Likewise, a reception filter 22a and a reception filter 22b define a second chip component 22. Here, the transmission filter 21a and the transmission filter 21b each include a plurality of elastic wave resonators. Additionally, in the present preferred embodiment, the transmission filters 21a and 21b are provided to reduce the level of non-linear signals. In this case, at least one of the plurality of elastic wave resonators in the transmission filters 21a and 21b may include the configuration according to the present invention. In other words, it is sufficient for the minimum value of the absolute value of the distortion $S_4$ component in the first main surface to be about $1.4 \times 10^{-3}$ or less at the frequency f expressed by the formula described above. As such, in the case where it is necessary for the level of non-linear signals to be reduced only in the transmission filters 21a and 21b, the transmission filters 21a and 21b are easily provided as the single first chip component 21. On the other hand, it is not necessary for the level of non-linear signals to be reduced in the reception filters 22a and 22b, and thus a decrease in the freedom of design in the second chip component 22 is able to be reduced as well.

Thus, in a communication device including a plurality of duplexers, it is desirable that a plurality of transmission filters define a first chip component and a plurality of reception filters define a second chip component. Additionally, in the case where it is necessary to reduce the level of non-linear signals only in the plurality of reception filters rather than in the plurality of transmission filters, it is sufficient that at least one of the plurality of elastic wave resonators of the reception filter has a structure according to one of the preferred embodiments of the present invention. In this case too, the plurality of reception filters are easily implemented as a single chip component.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave resonator comprising:
a piezoelectric substrate; and
an interdigital transducer electrode located on the piezoelectric substrate; wherein
the interdigital transducer electrode includes a first electrode layer made of Al or an alloy including Al as its primary component and including a first main surface on a side where the piezoelectric substrate is located and a second main surface on an opposite side from the first main surface;
an SH wave is used as a propagated elastic wave;
a resonant frequency of the elastic wave resonator is fr and an anti-resonant frequency of the elastic wave resonator is fa, a minimum value of an absolute value of a distortion $S_4$ component in the first main surface calculated through a two-dimensional finite element method is about $1.4 \times 10^{-3}$ or less at a frequency f expressed as:

$$f = fr + 0.06 \times bw, \text{ where } bw \text{ is } fa-fr.$$

2. The elastic wave resonator according to claim 1, wherein a maximum value of the absolute value of the distortion $S_4$ component in the first main surface calculated through a two-dimensional finite element method is about $2.7 \times 10^{-3}$ or less at the frequency f.

3. The elastic wave resonator according to claim 1, wherein
the interdigital transducer electrode includes a second electrode layer located on the piezoelectric substrate;
the first electrode layer is laminated on the second electrode layer; and
the second electrode layer includes at least one type of metal selected from a group consisting of Ti, Pt, Mo, W, Au, Cu, Ag, and NiCr.

4. The elastic wave resonator according to claim 3, wherein
the first electrode layer includes a side surface connecting the first main surface and the second main surface, and at least a portion of the side surface makes contact with the second electrode layer; and
a minimum value of an absolute value of the distortion $S_4$ component in the portion of the side surface of the first electrode layer that makes contact with the second electrode layer is about $1.4 \times 10^{-3}$ or less.

5. The elastic wave resonator according to claim 3, wherein
the first electrode layer includes a side surface connecting the first main surface and the second main surface, and at least a portion of the side surface makes contact with the second electrode layer; and
a maximum value of an absolute value of the distortion $S_4$ component in the portion of the side surface of the first electrode layer that makes contact with the second electrode layer is about $2.7 \times 10^{-3}$ or less.

6. The elastic wave resonator according to claim 3, wherein
the second electrode layer covers the first and second main surfaces and the side surface of the first electrode layer; and
a minimum value of an absolute value of the distortion $S_4$ component in the first and second main surfaces and the side surface of the first electrode layer is about $1.4 \times 10^{-3}$ or less.

7. The elastic wave resonator according to claim 3, wherein
the second electrode layer covers the first and second main surfaces and the side surface of the first electrode layer; and
a maximum value of an absolute value of the distortion $S_4$ component in the first and second main surfaces and the side surface of the first electrode layer is about $2.7 \times 10^{-3}$ or less.

8. The elastic wave resonator according to claim 1, wherein the alloy with Al as its primary component is an alloy of Al and Cu.

9. An elastic wave filter comprising:
a plurality of elastic wave resonators; wherein at least one of the plurality of elastic wave resonators is the elastic wave resonator according to claim 1.

10. A duplexer comprising:
a band pass first filter including a plurality of elastic wave resonators, and a second filter including a plurality of elastic wave resonators and including a different pass band from the first filter; wherein
at least one of elastic wave resonators in at least one of the plurality of elastic wave resonators in the first and second filters is the elastic wave resonator according to claim 1.

11. An elastic wave device comprising:
a first chip component including a plurality of transmission filters; and
a second chip component including a plurality of reception filters; wherein
the plurality of transmission filters or the plurality of reception filters includes a plurality of elastic wave resonators; and
at least one of elastic wave resonators in the plurality of elastic wave resonators is the elastic wave resonator according to claim 1.

12. An elastic wave resonator comprising:
a piezoelectric substrate; and
an interdigital transducer electrode located on the piezoelectric substrate; wherein
the interdigital transducer electrode includes a first electrode layer made of Al or an alloy having Al as its primary component and including a first main surface on a side where the piezoelectric substrate is located and a second main surface on an opposite side from the first main surface;
an SH wave is used as a propagated elastic wave;
a resonant frequency of the elastic wave resonator is represented by fr and an anti-resonant frequency of the elastic wave resonator is represented by fa, a maximum value of an absolute value of a distortion $S_4$ component in the first main surface calculated through a two-dimensional finite element method is about $2.7 \times 10^{-3}$ or less at a frequency f expressed as:

$f=fr+0.06 \times bw$, where $bw$ is $fa-fr$.

13. The elastic wave resonator according to claim 12, wherein
the interdigital transducer electrode includes a second electrode layer located on the piezoelectric substrate;
the first electrode layer is laminated on the second electrode layer; and
the second electrode layer includes at least one type of metal selected from a group consisting of Ti, Pt, Mo, W, Au, Cu, Ag, and NiCr.

14. The elastic wave resonator according to claim 13, wherein
the first electrode layer includes a side surface connecting the first main surface and the second main surface, and at least a portion of the side surface makes contact with the second electrode layer; and
a minimum value of an absolute value of the distortion $S_4$ component in the portion of the side surface of the first electrode layer that makes contact with the second electrode layer is about $1.4 \times 10^{-3}$ or less.

15. The elastic wave resonator according to claim 13, wherein
the first electrode layer includes a side surface connecting the first main surface and the second main surface, and at least a portion of the side surface makes contact with the second electrode layer; and
a maximum value of an absolute value of the distortion $S_4$ component in the portion of the side surface of the first electrode layer that makes contact with the second electrode layer is about $2.7 \times 10^{-3}$ or less.

16. The elastic wave resonator according to claim 13, wherein
the second electrode layer covers the first and second main surfaces and the side surface of the first electrode layer; and
a minimum value of an absolute value of the distortion $S_4$ component in the first and second main surfaces and the side surface of the first electrode layer is about $1.4 \times 10^{-3}$ or less.

17. The elastic wave resonator according to claim 13, wherein
the second electrode layer covers the first and second main surfaces and the side surface of the first electrode layer; and
a maximum value of an absolute value of the distortion $S_4$ component in the first and second main surfaces and the side surface of the first electrode layer is about $2.7 \times 10^{-3}$ or less.

18. The elastic wave resonator according to claim 12, wherein the alloy with Al as its primary component is an alloy of Al and Cu.

19. An elastic wave filter comprising:
a plurality of elastic wave resonators; wherein
at least one of the plurality of elastic wave resonators is the elastic wave resonator according to claim 12.

20. A duplexer comprising:
a band pass first filter including a plurality of elastic wave resonators, and a second filter including a plurality of elastic wave resonators and including a different pass band from the first filter; wherein
at least one of elastic wave resonators in at least one of the plurality of elastic wave resonators in the first and second filters is the elastic wave resonator according to claim 12.

21. An elastic wave device comprising:
a first chip component including a plurality of transmission filters; and
a second chip component including a plurality of reception filters; wherein
the plurality of transmission filters or the plurality of reception filters includes a plurality of elastic wave resonators; and
at least one of elastic wave resonators in the plurality of elastic wave resonators is the elastic wave resonator according to claim 12.

* * * * *